United States Patent
Hiruta et al.

(10) Patent No.: US 11,604,447 B2
(45) Date of Patent: Mar. 14, 2023

(54) CONDITION MONITORING SYSTEM

(71) Applicant: Hitachi, Ltd., Tokyo (JP)

(72) Inventors: Tomoaki Hiruta, Tokyo (JP); Hideaki Suzuki, Tokyo (JP); Takayuki Uchida, Tokyo (JP); Akihiro Komasu, Tokyo (JP)

(73) Assignee: HITACHI, LTD., Tokyo (JP)

(*) Notice: Subject to any disclaimer, the term of this patent is extended or adjusted under 35 U.S.C. 154(b) by 360 days.

(21) Appl. No.: 16/954,232

(22) PCT Filed: Feb. 23, 2018

(86) PCT No.: PCT/JP2018/006658
§ 371 (c)(1),
(2) Date: Jun. 16, 2020

(87) PCT Pub. No.: WO2019/163084
PCT Pub. Date: Aug. 29, 2019

(65) Prior Publication Data
US 2021/0055706 A1    Feb. 25, 2021

(51) Int. Cl.
*G05B 19/042* (2006.01)
(52) U.S. Cl.
CPC .............. *G05B 19/0428* (2013.01); *G05B 2219/24015* (2013.01)
(58) Field of Classification Search
CPC .................................................. G05B 19/0428
See application file for complete search history.

(56) References Cited

U.S. PATENT DOCUMENTS

2004/0102891 A1    5/2004  Ehara
2013/0024179 A1*   1/2013  Mazzaro ............... F01D 17/20
                                                    703/18
(Continued)

FOREIGN PATENT DOCUMENTS

JP    2004-178247 A    6/2004
JP    2015-203936 A   11/2015
(Continued)

OTHER PUBLICATIONS

Extended European Search Report received in corresponding European Application No. 18906938.8 dated Aug. 4, 2021.
(Continued)

*Primary Examiner* — Ronald D Hartman, Jr.
(74) *Attorney, Agent, or Firm* — Mattingly & Malur, PC

(57) ABSTRACT

A condition monitoring system which collects operation data from a machine and monitors a condition of the machine includes: a storage unit that stores information indicating components of a first machine for which a model for a sensor data analysis has been created and components of a second machine for which the model is newly created, information indicating a correspondence relationship between the components of the first machine and the components of the second machine, and information relating to the model; a model creation unit that creates model candidates of the second machine from the model similar to the second machine by using the information stored in the storage unit, and creating information relating to a model candidate selected via an input unit out of the model candidates as the model of the second machine; and a display unit that displays the model candidates.

6 Claims, 13 Drawing Sheets

(56) References Cited

U.S. PATENT DOCUMENTS

2014/0129187 A1* 5/2014 Mazzaro ............ G05B 23/0251
703/2
2015/0149134 A1* 5/2015 Mehta ................ G05B 23/0245
703/6
2017/0102982 A1* 4/2017 Kolandavelu ...... G05B 23/0248

FOREIGN PATENT DOCUMENTS

JP          2015203936 A * 11/2015 ............. G05B 23/02
JP            6243080 B1   12/2017

OTHER PUBLICATIONS

International Search Report of PCT/JP2018/006658 dated May 22, 2018.

* cited by examiner

[FIG. 1]
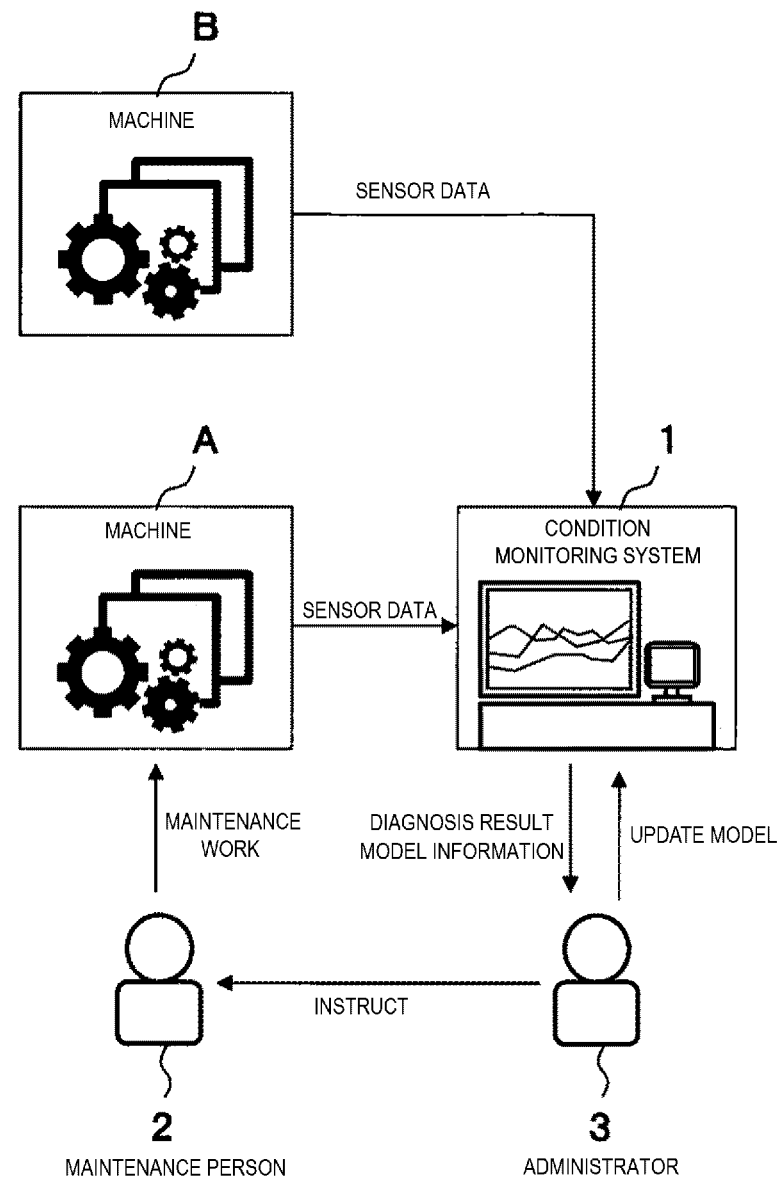

[FIG. 2]
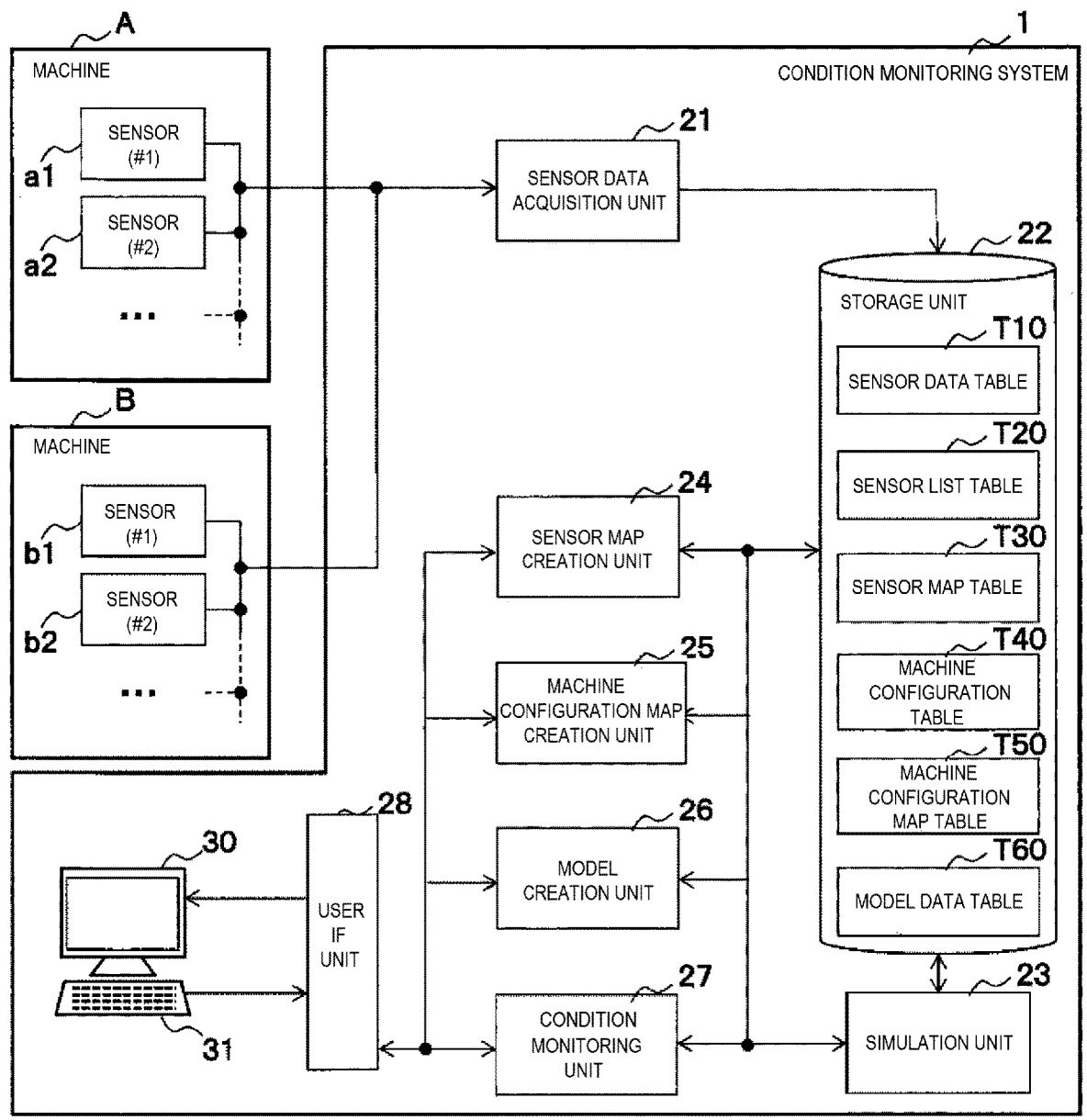

| TIME POINT | a1 | a2 | a3 | a4 | a5 | a6 |
|---|---|---|---|---|---|---|
| 2014/9/27 10:00:00 | 15 | 0 | 4 | 1000 | 10 | 2000 |
| 2014/9/27 10:01:00 | 10 | 3 | 3 | 800 | 8 | 1600 |
| 2014/9/27 10:02:00 | 5 | 3 | 0 | 300 | 3 | 500 |
| ... | ... | ... | | | | |
| ... | ... | ... | | | | |

101-B  T10-B

| TIME POINT | b1 | b2 | b3 | b4 | b5 | b6 |
|---|---|---|---|---|---|---|
| 2015/4/2 10:00:00 | 15 | 5 | 5 | 1000 | 10 | 2000 |
| 2015/4/2 10:01:00 | 12 | 12 | 3 | 800 | 8 | 1600 |
| 2015/4/2 10:02:00 | 10 | 11 | 3 | 600 | 6 | 1000 |
| ... | ... | ... | | | | |
| ... | ... | ... | | | | |

| SENSOR ID | SENSOR NAME |
|---|---|
| a1 | WIND SPEED [m/s] |
| a2 | WIND DIRECTION [deg] |
| a3 | PITCH ANGLE [deg] |
| a4 | ROTATION NUMBER OF SPEED INCREASING MACHINE [rpm] |
| a5 | ROTATION NUMBER OF ELECTRIC GENERATOR [rpm] |
| a6 | ELECTRIC GENERATOR ACCELERATION [m/s$^2$] |
| a7 | POWER GENERATION AMOUNT [kW] |

| MACHINE A | MACHINE B |
|---|---|
| a1 | b1 |
| a2 | b2 |
| a3 | b3 |
| ... | ... |
| an | bm + bn |
| ... | ... |

[FIG. 6]
(a)
T40
| COMPONENT ID | COMPONENT NAME | MODEL ID | SENSOR | | | CONNECTED COMPONENT ID |
|---|---|---|---|---|---|---|
| | | | INPUT | STATE | OUTPUT | |
| ac1 | BLADE | am1 | a1, a2 | a3 | a7 | ac2, ac6 |
| ac2 | ROTOR | am2 | a7 | — | a8 | ac1, ac3 |
| ac3 | SPEED INCREASING MACHINE | am3 | a8 | a4 | a4 | ac2, ac4, ac6 |
| ac4 | ELECTRIC GENERATOR | am4 | a4 | a5, a6 | a7 | ac3, ac5, ac6 |
| ac5 | VOLTAGE TRANS-FORMING MACHINE | am5 | a7 | a9 | a10 | ac4 |
| ac6 | PITCH CONTROLLER | am6 | a1, a5 | — | a3 | ac1, ac3, ac4 |
(b)
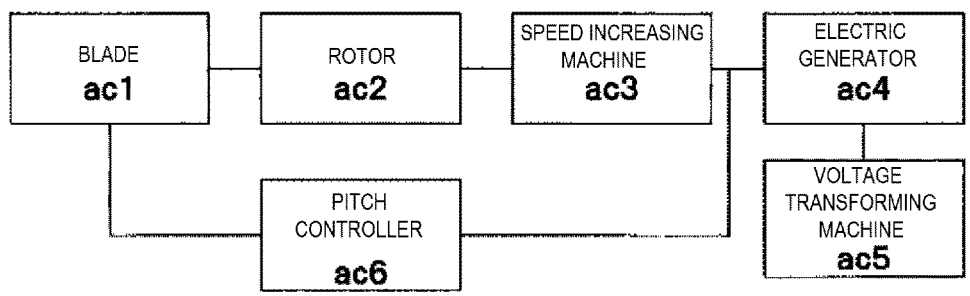

| MACHINE A (501) | MACHINE B (502) |
|---|---|
| ac1 | bc1 |
| ac2 | bc2 |
| ac3 | bc3 |
| ac4 | bc4 |
| ac5 | bc5 |
| ac6 | bc6 |

| MODEL ID (601) | TYPE (602) | MODEL METADATA (603) | | | | | | MODEL DATA (604) |
|---|---|---|---|---|---|---|---|---|
| | | INDUCTION MODEL | | | DEDUCTION MODEL | | | |
| | | PRE-PROCESSING | MODELING | DETERMINATION METHOD | PHYSICAL MODEL | PARAMETER | DETERMINATION METHOD | |
| am1 | INDU-CTION | a1, a2, a5 a1>15 | K-means NUMBER OF CLUSTERS: 3 | DISTANCE>3 | — | — | — | ... |
| am2 | INDU-CTION | a3, a4 | DNN AUTOMATIC ENCODER | ERROR>3 | — | — | — | ... |
| am3 | DEDU-CTION | — | — | — | Y=r*X | Y:a4 X:a8 r=100 | PRIORI CALCULATION METHOD r = 50 to 120 | ... |
| ... | ... | ... | ... | ... | ... | ... | ... | ... |

[FIG. 9]
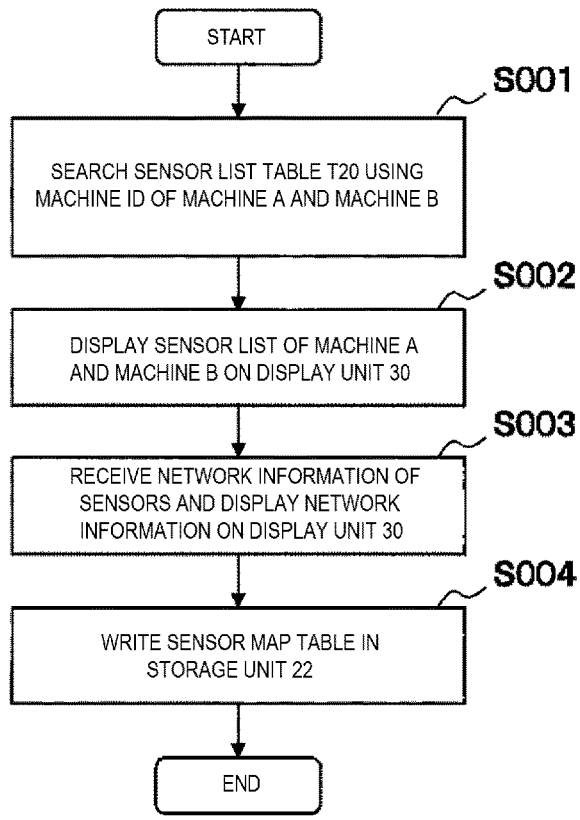

[FIG. 10]
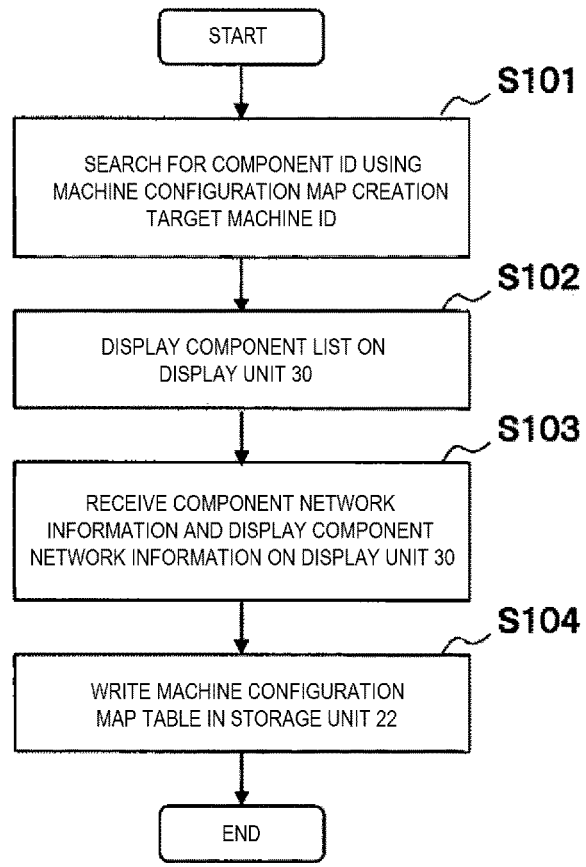

[FIG. 11]
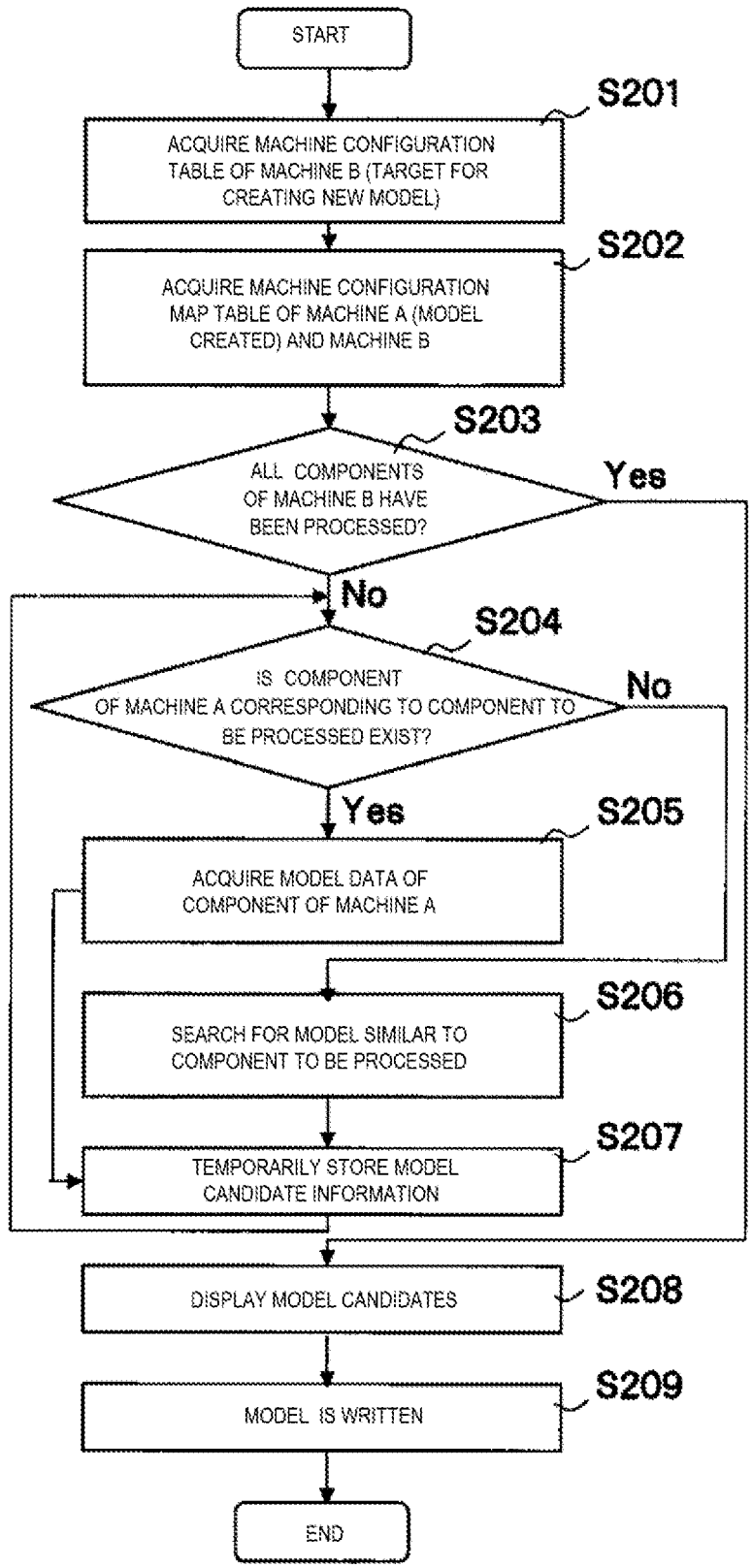

[FIG. 12]
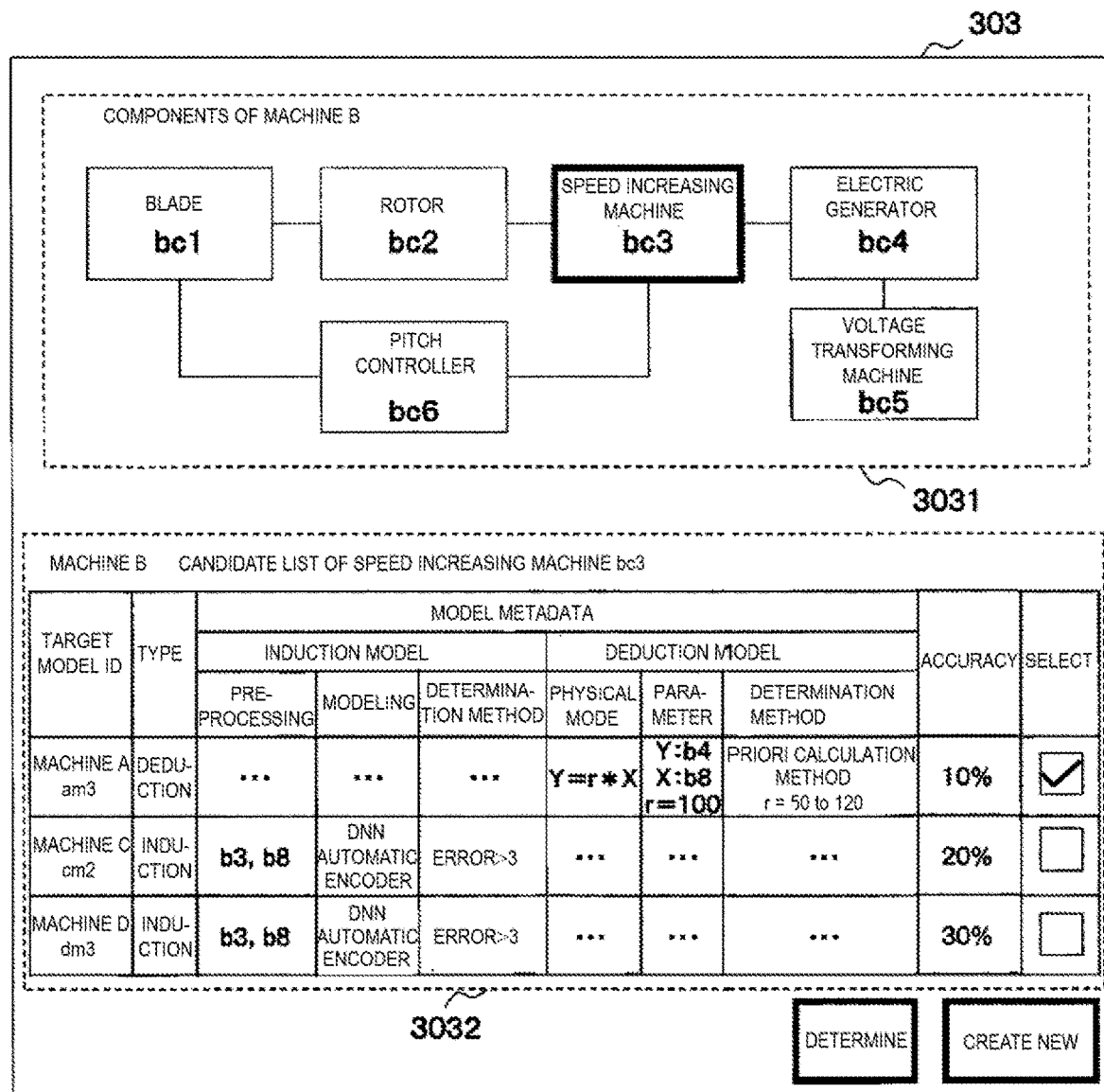

[FIG. 13]
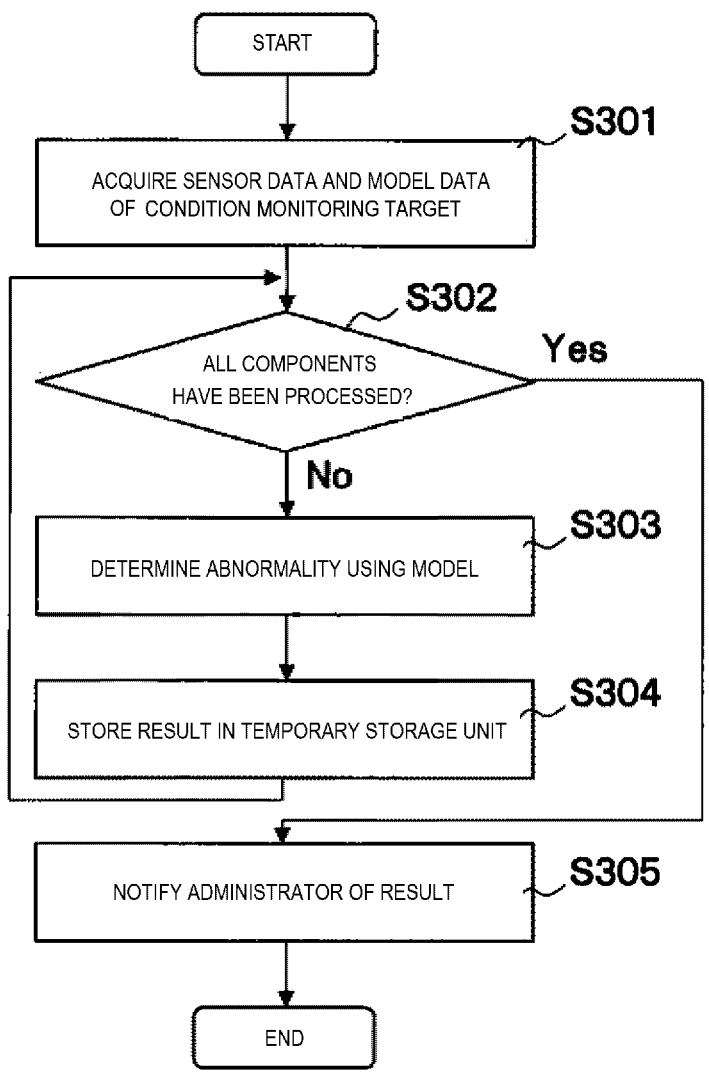

[FIG. 14]
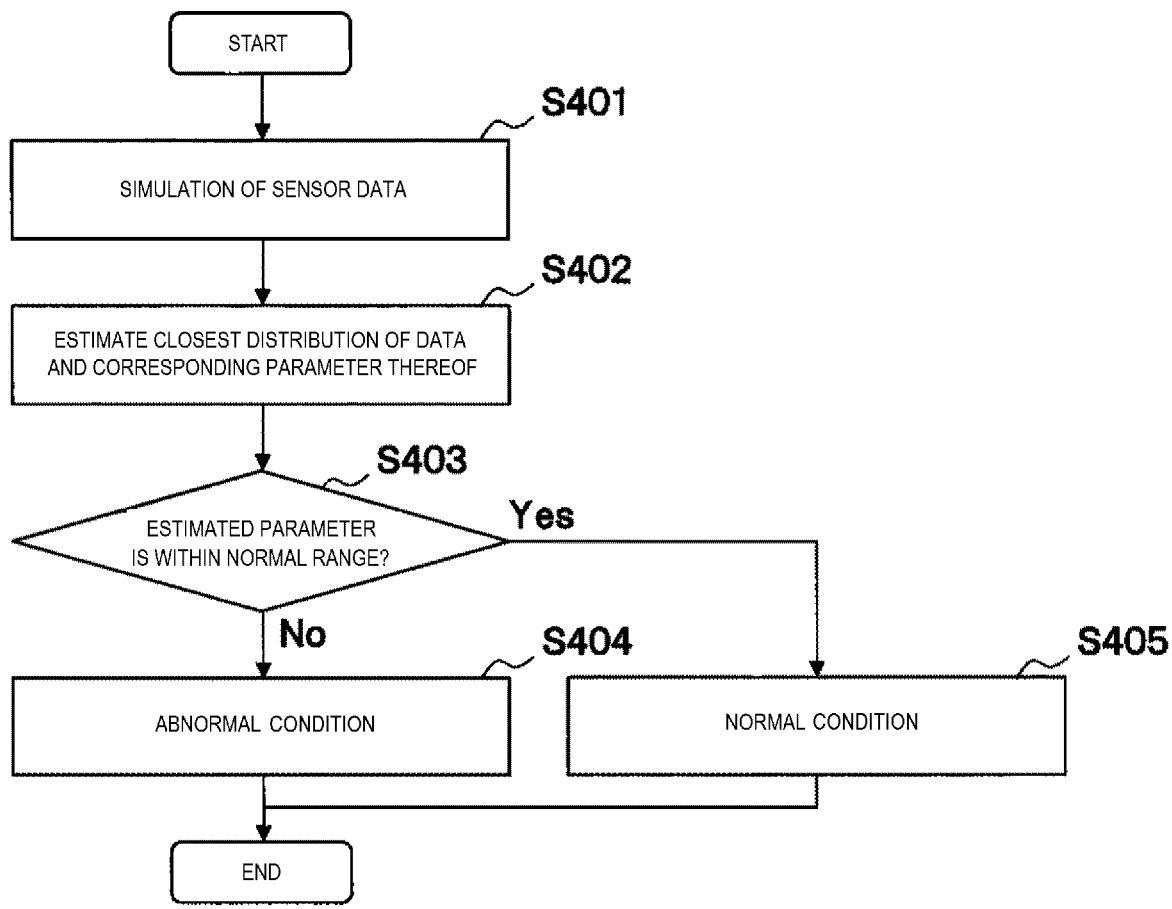

[FIG. 15]
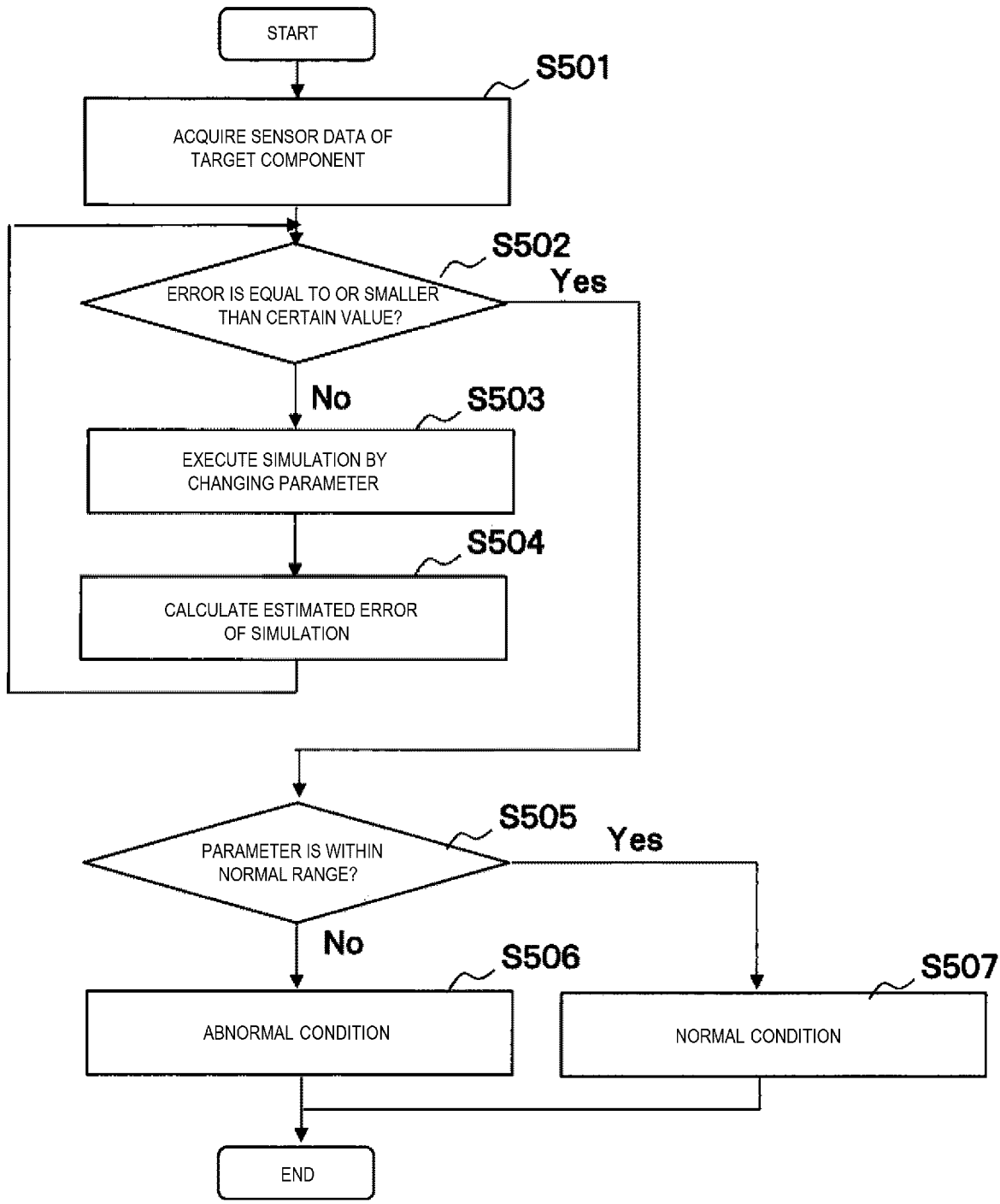

CONDITION MONITORING SYSTEM

TECHNICAL FIELD

The present invention relates to a condition monitoring system.

BACKGROUND ART

A machine for a social infrastructure such as a gas turbine for generating electricity is required to operate at all times. In order to maintain a high operating rate of the machine, it is necessary to prevent an unplanned outage thereof. For the purpose, it is necessary for a transition from periodic maintenance based on an operating time of the machine to condition-based maintenance in which preventive maintenance is properly performed based on a condition of the machine. In order to achieve the condition-based maintenance, a condition monitoring system plays an important role in analyzing sensor data collected via various sensors provided in the machine and diagnosing a sign of an abnormality or a failure of the machine.

In the condition monitoring system, condition monitoring is performed using a model of sensor data analysis (hereinafter, simply referred to as a "model") for each component of the machine. When a condition monitoring system is newly introduced into a specific machine, it is desirable to reuse a model for a machine similar to a model for a specific machine which has already been created as much as possible because it costs manhours to newly create such a model.

As an example of reusing a model in the related art, it is known that a final model is generated by combining a simulation model in consideration of physical properties of a machine and a correction function derived based on a difference between simulation data and measurement data of a real machine (see PTL 1).

CITATION LIST

Patent Literature

PTL 1: JP-A-2004-178247

SUMMARY OF INVENTION

Technical Problem

However, when the final model is generated by combining the created model and the correction function, there is a limit to absorbing a difference between a machine for which the model has been created and a machine for which a model is newly created only by the correction function. Therefore, in order to newly introduce a condition monitoring system into a specific machine, it is necessary to newly create a model for each component of the machine, and it is difficult to reduce manhours for model creation.

The invention is made to solve the above-described problems, and an object thereof is to provide a condition monitoring system that can reduce manhours for model creation even when there is a difference between a machine for which a model has been created and a machine for which a model is newly created.

Solution to Problem

In order to solve the above-described problem, a condition monitoring system that collects operation data from a machine and monitors a condition of the machine includes: a storage unit that stores information indicating components of a first machine for which a model for a sensor data analysis has been created and components of a second machine for which the model is newly created, information indicating a correspondence relationship between the components of the first machine and the components of the second machine, and information relating to the model; a model creation unit that creates model candidates of the second machine from the model similar to the second machine by using the information stored in the storage unit, and creates information relating to a model candidate selected via an input unit out of the model candidates as the model of the second machine; and a display unit that displays the model candidates.

Advantageous Effect

According to the invention, it is possible to reduce manhours for model creation when there is a difference between a machine for which a model has been created and a machine for which a model is newly created. Further, as the manhours for model creation are reduced, an introduction cost of a condition monitoring system can be reduced.

BRIEF DESCRIPTION OF DRAWINGS

FIG. 1 is a diagram showing a system configuration example showing a relationship between a machine A, a machine B, and a condition monitoring system 1 according to an embodiment of the invention.

FIG. 2 is a diagram showing a functional configuration example of the condition monitoring system 1 according to the embodiment of the invention.

FIG. 3 is a diagram showing a configuration example of a sensor data table T10.

FIG. 4 is a diagram showing a configuration example of a sensor list table T20.

FIG. 5 is a diagram showing a configuration example of a sensor map table T30.

FIG. 6 is a diagram showing a configuration example of a machine configuration table T40 and a configuration example of a wind electric power generation system.

FIG. 7 is a diagram showing a configuration example of a machine configuration map table T50.

FIG. 8 is a diagram showing a configuration example of a model data table T60.

FIG. 9 is a flowchart showing processing of a sensor map creation unit 24 and a diagram showing an example of a screen displayed on a display unit 30.

FIG. 10 is a flowchart showing processing of a machine configuration map creation unit 25 and a diagram showing an example of a screen displayed on the display unit 30.

FIG. 11 is a flowchart showing processing of a model creation unit 26.

FIG. 12 is a diagram showing an example of a screen shown by a user when creating a model.

FIG. 13 is a flowchart showing processing of a condition monitoring unit 27.

FIG. 14 is a flowchart showing processing of a priori calculation method of a deduction model.

FIG. 15 is a flowchart showing processing of a parameter estimation method of the deduction model.

DESCRIPTION OF EMBODIMENTS

Hereinafter, an embodiment of the invention will be described in detail with reference to drawings. A case will be described in which a model of a machine B (second machine) is newly created using a model (created) of each component of a machine A (first machine). It is assumed that the machine A and the machine B are products of the same manufacturer but different models, or that the machine A and the machine B are products of different manufacturers.

FIG. 1 is a diagram showing a system configuration example showing a relationship between the machine A, the machine B, and the condition monitoring system 1 according to an embodiment of the invention. The machine A and the machine B are monitoring target machines monitored by the condition monitoring system 1 that collects operation data from a machine and monitors a condition of the machine, and are targets of maintenance work by a maintenance person 2 when an abnormality or a sign of abnormality (hereinafter, simply referred to as "abnormality") is detected periodically or by the condition monitoring system 1.

Various sensors (not shown) are mounted on the machine A and the machine B. Sensor data of the machine A and the machine B measured by the various sensors are output to the condition monitoring system 1. As the machine A and the machine B, any device may be used as long as it is a device that achieves a desired function by performing mechanical operation.

The condition monitoring system 1 includes a display device, an operation console, a control computer, a personal computer, a workstation (not shown), and the like, and is connected to the machine A and the machine B via a wired or wireless communication system. The condition monitoring system 1 collects and aggregates the sensor data from the machine A and the machine B, periodically diagnoses presence or absence of abnormality in the machine A and the machine B according to a predetermined abnormality determination method using a model, and notifies an administrator 3 of the diagnosis result.

A deduction model or an induction model is used as a model used in an analysis of sensor data. A deduction model refers to a physical model and expresses a physical phenomenon or behavior of a component of a target machine by a mathematical expression. When the behavior of the collected sensor data is determined using the physical model and deviates from a condition assumed by the physical model, the condition of the machine is regarded as abnormal. A target of the physical model is not limited to an electric system, a mechanical system, a heat transfer system, a fluid system, a chemical reaction system, a control system, or the like.

On the other hand, the induction model shows a common pattern or rule extracted using a machine learning algorithm when a large amount of sensor data of a target machine is collected. For example, a clustering algorithm such as a k-means method is used to extract a distribution (cluster) of sensor data when the machine is operating normally. Then, when a distance between newly collected sensor data and the extracted cluster is calculated and the distance is equal to or greater than a certain value, the condition of the machine is regarded as abnormal. When an automatic encoder for deep learning is used, a normal condition is learned using the accumulated sensor data, and the newly collected sensor data is reconstructed by the automatic encoder. Next, an error between the reconstructed sensor data and input sensor data is calculated. When the error is equal to or greater than a certain value, the condition of the machine is regarded as abnormal.

For example, in a case of a wind electric power generation system, a condition monitoring of blades is performed using the deduction model, and a condition monitoring of an electric generator is performed using the induction model.

When the administrator 3 knows the abnormality of the machine A or the machine B based on the notification of the diagnosis result from the condition monitoring system 1, the administrator 3 instructs the maintenance person 2 on site to perform the maintenance work of the machine A or the machine B. When introducing condition monitoring of a new machine, the administrator 3 updates the deduction model and the induction model for monitoring a condition of the new machine through a continuous screen of the condition monitoring system 1.

FIG. 2 is a diagram showing a functional configuration example of the condition monitoring system 1 according to the embodiment of the invention. As shown in FIG. 2, the condition monitoring system 1 includes a sensor data acquisition unit 21, a storage unit 22, a simulation unit 23, a sensor map creation unit 24, a machine configuration map creation unit 25, a model creation unit 26, a condition monitoring unit 27, a user IF unit 28, a display unit 30, and an input unit 31.

Here, functions of the sensor data acquisition unit 21, the simulation unit 23, the sensor map creation unit 24, the machine configuration map creation unit 25, the model creation unit 26, the condition monitoring unit 27, and the user IF (interface) 28 are achieved by an arithmetic processing device that executes a predetermined program stored in the storage device. The storage unit 22 is a storage device such as a random access memory (RAM), a hard disk drive (HDD), or a solid state drive (SSD), and stores data related to a model.

Hereinafter, the functions will be described in detail. Here, the machine A and the machine B are wind electric power generation systems. The wind electric power generation system is a system that converts wind power into electric power, and includes a plurality of components. Specifically, blades of a wind turbine are rotated by wind. The rotation is transmitted to a nacelle through a rotor. In the nacelle, rotational force is transmitted to a speed increasing machine through a main shaft. In the speed increasing machine, a gear is used to increase a rotational speed, and an electric generator is rotated at the rotational speed to convert the force into electricity. The generated electricity is boosted by a voltage transforming device and delivered through a power transmission wire.

The wind electric power generation system also includes a pitch control system that adjusts an angle (pitch angle) of the blades in order to turn aside wind from the blades during control of a power generation amount and during strong wind. In the wind electric power generation system, a plurality of sensors are attached to main components for condition monitoring, and data is measured at a constant sampling interval. Then, the wind electric power generation system periodically transmits the measured sensor data to the condition monitoring system 1.

The sensor data acquisition unit 21 periodically collects sensor data of a machine connected to the condition monitoring system 1 and writes the sensor data in a sensor data table of the storage unit 22.

The storage unit 22 includes the sensor data table T10 that stores the sensor data, the sensor list table T20 that stores information indicating a corresponding relationship between the sensors and the components, the sensor map table T30 that stores information indicating a corresponding relationship between the sensors of the machine A and the sensors of the machine B, the machine configuration table T40 that stores information indicating the components of the machine A and machine B, the machine configuration map table T50 that stores information indicating a corresponding relationship between the components of the machine A and the components of the machine B, and the model data table T60 that stores information indicating models of the components.

FIG. 3 is a diagram showing a configuration example of the sensor data table T10. The sensor data table T10 includes tables T10-A and T10-B for each machine connected to the condition monitoring system 1. The sensor data table T10 of FIG. 3 shows the machine A and the machine B (both of which are wind electric power generation systems). The sensors are provided with sensor IDs a1 to a6 and b1 to b6. The sensor ID is defined for each machine. For example, an ID of a sensor relating to the same wind speed is defined as a1 in the machine A and b1 in the machine B.

In tables T10-A and T10-B of each machine, sensor data is recorded for each acquisition time points 101-A and 101-B. Sensor data recorded in the sensor data table T10 is not limited to the sensor data shown in FIG. 3. The sensor data tables T10-A and T10-B are updated at a stage where data is acquired from the sensor data acquisition unit 21.

FIG. 4 is a diagram showing a configuration example of the sensor list table T20. The sensor list table T20 is created by the administrator 3 familiar with the machines based on design information. In the sensor list table T20, a sensor ID 201 and a sensor name 202 are recorded for each machine. Here, the sensor list table of the machine A is shown, and the sensors a1 to a7 are shown as sensors that acquire the wind speed (m/s), the wind direction (m/s), a pitch angle (deg), a rotation number of the speed increasing machine (rpm), a rotation number of the electric generator (m/s), electric generator acceleration (m/s$^2$), and the power generation amount (kW), respectively.

FIG. 5 is a diagram showing a configuration example of the sensor map table T30. The sensor map table T30 records corresponding relationship between sensors of a plurality of machines. The sensor map table T30 is created by the sensor map creation unit 24 through the user IF unit 28. The sensor map table T30 shows the corresponding relationship between the sensor 301 of the machine A and the sensor 302 of the machine B. It is shown that the sensor a1 indicating the wind speed, the sensor a2 indicating the wind direction, and the sensor a3 indicating the pitch angle correspond to b1 to b3, respectively. It is shown that a sensor an of the machine A corresponds to a sum of sensors bm and bn of the machine B. In this manner, a single sensor of the machine A (or the machine B) and a combination of a plurality of sensors of the machine B (or the machine A) may have a corresponding relationship.

FIG. 6 is a diagram showing a configuration example of the machine configuration table T40 and a configuration example of the wind electric power generation system of the machine A. Similar to the sensor list table T20, the machine configuration table T40 is created by the administrator familiar with the machines based on the design information.

FIG. 6(a) shows the machine configuration table T40 of the machine A (wind electric power generation system). The machine configuration table T40 includes an ID (component ID) 401 of each component constituting the machine, a component name 402, a model ID 403 of the corresponding model data table T60, a sensor ID 404 of the sensor list table T20 of each associated sensor, and a connected component ID 405.

FIG. 6(b) shows the configuration example of the wind electric power generation system of the machine A. The machine A includes a blade ac1, a rotor ac2, a speed increasing machine ac3, an electric generator ac4, a voltage transforming machine ac5, and a pitch controller ac6. It is assumed that a configuration of the machine B is the same although details of the components thereof may be different.

The rotor ac2, the electric generator ac4, and the pitch controller ac6 are described as the connected component ID 405 of the speed increasing machine ac3 since the components connected to the speed increasing machine ac3 are the rotor ac2, the electric generator ac4, and the pitch controller ac6. Sensor IDs of the sensor list table T20 corresponding to an input of the component, a condition in the component, and an output of the component are recorded in the sensor ID 404. For example, a rotation number a4 of the speed increasing machine ac3 is recorded in the item of "input" of the sensor ID 404 since the rotation number a4 of the speed increasing machine ac3 is used as an input value when generating electricity by the electric generator ac4. A rotation number a5 and an acceleration a6 of the electric generator ac4 are recorded in the item of "condition" of the sensor ID 404 since the rotation number a5 and the acceleration a6 of the electric generator ac4 indicate the condition of the electric generator ac. A power generation amount a7 is recorded in the item of "output" of the sensor ID 404 since an output value of the electric generator ac4 is the power generation amount a7.

FIG. 7 is a diagram showing a configuration example of the machine configuration map table T50. The machine configuration map table T50 is created by the machine configuration map creation unit 25 through the user IF unit 28. A corresponding relationship between a component ID 501 of the machine A and a component ID 502 of the machine B is recorded in the machine configuration map table T50. The above corresponds to the component ID described in the machine configuration table T40.

FIG. 8 is a diagram showing a configuration example of the model data table T60. A created model is stored in the model data table T60. Specifically, a model ID 601, a model type (deduction model or induction model) 602, a model metadata 603 showing an outline of the model, and model data 604 that is a content of the model are included.

When the model type is "induction", items of "pre-processing" executed before machine learning is executed, "modeling" indicating a machine learning algorithm and parameters, and "determination method" are stored in the model metadata 603. In the item of "pre-processing", a sensor ID necessary for creating the induction model, a condition for extracting a specific condition (for example, a steady condition) of the machine, and the like are stored. In the item of "modeling", specific machine learning algorithms and parameters are stored. In the item of "determination method", information of whether the machine is determined to be abnormal as a result of calculation by the machine learning algorithm is stored.

For example, when the model ID 601 is a model of "am1" (that is, a model for detecting an abnormality of a machine using a clustering algorithm such as k-means), the wind speed a1, the wind direction a2, and the electric generator rotation number a5 are stored in the item of "pre-processing" as sensor IDs of sensors to be input to the clustering algorithm. A condition (a1>15) of the wind speed a1 is also stored in the item of "pre-processing" when the induction model in a case of strong wind is created as a specific condition of the machine. In the item of "modeling", a name of k-means and the parameter (number of clusters in the case of k-means) thereof are described as information of an algorithm. In an approach using k-means, when new data is input, a distance between each cluster and a center coordinate is calculated, and when the distance is larger than a threshold value by a predetermined value or more, the condition of the machine is regarded as abnormal. A threshold value (here, the distance is larger than 3) of the distance determined to be abnormal is stored in the item of "determination method". Information of a learned model is stored in the model data 604. In the case of k-means, center coordinates of the clusters are used.

When the model ID 601 is a model of am2 (model using an automatic encoder for deep learning), the sensor ID to be input is stored in the item of "pre-processing". Information of an input layer, a hidden layer, and an output layer of the automatic encoder is stored in the item of "modeling". In an approach using an automatic encoder, the accumulated sensor data is used to learn a normal condition, and newly collected sensor data is reconstructed by the automatic encoder. Next, the error between the reconstructed sensor data and input sensor data is calculated, and if the error is larger than a predetermined value, the condition of the machine is regarded as abnormal. A threshold value (here, the error is larger than 3) of the error determined to be abnormal is stored in the item of "determination method".

When the model type is "deduction", items of "physical model", "parameter", and "abnormality determination method" are stored in the model metadata 603 as information related to a mathematical expression or the like representing a physical phenomenon. For example, when a brake using friction is modeled as a physical model, a mathematical expression representing the behavior of the brake is stored in the item of "physical model". In the item of "parameter", a friction coefficient and a spring friction coefficient of the brake are stored. A sensor ID of a sensor associated with a variable or a parameter of each model is also stored.

When the model ID 601 is a model of am3 (physical model of the speed increasing machine ac3), X and Y indicate the rotation number of the input of the speed increasing machine ac3 and the rotation number of the output of the speed increasing machine ac3, respectively, and Y corresponds to the rotation number a4 of the speed increasing machine ac3. In addition, r corresponds to a gear ratio of the speed increasing machine ac3. When the rotation number Y of the output of the speed increasing machine ac3 is 100 times of the rotation number X of the input of the speed increasing machine ac3, r=100 is stored.

In the item of "abnormality determination method", a type of the abnormality determination method and the parameter are stored. The determination of the abnormality in the deduction model includes two types of "priori calculation method" and "parameter estimation method", and both are executed by the simulation unit 23. When the model ID 601 is the model of am3, the "priori calculation method" is used as the "abnormality determination method", and as a parameter at that time, the gear ratio r is changed from 50 to 120 to determine whether the speed increasing machine ac3 is normal.

The "priori calculation method" is a method of estimating a condition of a machine by calculating an output value in advance based on the condition of the parameter stored in the item of "abnormality determination method" and comparing the output value with a value acquired by the sensor data acquisition unit 21 by the condition monitoring unit 27. For example, when the output value at the parameter r=100 is closest to the value acquired by the sensor data acquisition unit 21, it is determined that the condition is normal. Then, when the output value at the parameter r=50 is closest to the value acquired by the sensor data acquisition unit 21, it is determined that the machine is in an abnormal condition because it greatly deviates from the parameter in the normal condition (i.e., r=100).

The "parameter estimation method" is a method of directly estimating parameters of the physical model by using the sensor data acquired by the sensor data acquisition unit 21. For example, when the gear ratio is estimated using input and output data of the speed increasing machine and the gear ratio is different from an assumed value, it is determined that the machine is in the abnormal condition.

The sensor map creation unit 24 creates the sensor map table T30 based on the sensor list table T20 and information input by the administrator 3 at the input unit 31 through the user IF unit 28.

FIG. 9(a) is a flowchart showing processing of the sensor map creation unit 24. FIG. 9(b) shows an example of a screen displayed on the display unit 30 when the sensor map table T30 is created. First, a sensor map creation target machine ID (here, referred to as a machine ID of the machine A and the machine B), which is input by the administrator 3 from the input unit 31, is received, and the sensor list table T20 is searched for a list of sensors of the machine A and the machine B (step S001). Subsequently, the sensor list 301 of the machine A and the machine B is displayed on the display unit 30 (step S002). Subsequently, a first network information indicating the corresponding relationship between the sensors of the machine A and the sensors of the machine B is received and displayed on the display unit 30 (step S003). Although the sensor a1 of the machine A and the sensor b1 of the machine B correspond to each other in the example of the screen shown in FIG. 9(b), the first network information is input by the administrator 3 at the input unit 31. That is, a sensor map table is created by inputting the first network information of the sensors of the target machine by the administrator 3 familiar with the machine. Finally, the created sensor map table is written in the sensor map table T30 of the storage unit 22 (step S004). When no corresponding sensor exists, information indicating that no corresponding sensor exists is recorded in the sensor map table T30.

In addition to recording the sensor map table T30 based on the information input by the administrator 3 at the input unit 31, the sensor map table T30 may be recorded based on the first network information generated by name identification between the name of the sensor of the machine A and the name of the sensor of the machine B. In this case, work of creating the sensor map by the administrator 3 can be reduced.

The machine configuration map creation unit 25 creates the machine configuration map table T50 based on the machine configuration table T40 and the information input by the administrator 3 at the input unit 31 through the user IF unit 28.

FIG. 10(a) is a flowchart showing processing of the machine configuration map creation unit 25. FIG. 10(b) shows an example of a screen displayed on the display unit 30 when the machine configuration map table T50 is created. First, a machine configuration map creation target machine ID (here, referred to as a machine ID of the machine A and the machine B), which is input by the administrator 3 from the input unit 31, is received, and the machine configuration table T40 is searched for a component ID of the target machine (step S101). Subsequently, the component 302 of the machine A and the machine B is displayed on the display unit 30 (step S102). Subsequently, a second network information indicating the corresponding relationship between the component of the machine A and the component of the machine B is received and displayed on the display unit 30 (step S103). Although the component ac1 (blade) of the machine A and the component bc1 (blade) of the machine B correspond to each other in the example of the screen shown in FIG. 10(*b*), the second network information is input by the administrator 3 at the input unit 31. That is, a machine configuration map table is created by inputting the second network information of the component of the target machine by the administrator 3 familiar with the machine. Finally, the machine configuration map table is written in the machine configuration map table T50 of the storage unit 22 (step S104). When no corresponding component exists, information indicating that no corresponding component exists is recorded in the machine configuration map table T50.

The model creation unit 26 creates a model data table of components of a new machine based on the information input by the administrator 3 at the input unit 31 by using the machine configuration table T40, the machine configuration map table T50, and the model data table T60 in the created model through the user IF unit 28.

FIG. 11 is a flowchart showing processing of the machine configuration map creation unit 25. First, a machine configuration table of the machine B for which a model is newly created is acquired from the machine configuration table T40 (step S201). Subsequently, information on the corresponding relationship between the components of the machine A (model created) and the components of the machine B is acquired from the machine configuration map table T50 (step S202). Subsequently, it is determined whether all components of the machine B have been processed (step S203). When processing of all the components of the machine B is not completed (step S203: No), it is determined whether a component of the machine A corresponding to a component to be processed of the machine B is in the machine configuration map table T50 (step S204). When the component of the machine A corresponding to the component to be processed of the machine B exists (step S204: Yes), the model data table T60 is searched for metadata and model data of the model data table by using the model ID corresponding to the corresponding component ID of the machine A (step S205).

On the other hand, when no component of the machine A corresponding to the component to be processed of the machine B exists (step S204: No), whether a similar model exists is searched from the model data table T60 (step S206). Specifically, a similar model is searched for using a component name and a configuration sensor name of the machine configuration table T40. A plurality of model candidates to be newly created exist by the processing of step S205 and the processing of step S206.

Subsequent to any one of step S205 or step S206, information related to the newly created model candidates is stored in a temporary storage unit (not shown) such as a RAM (step S207).

When the model candidate is a deduction model, sensor data associated with the target component of machine B is used to estimate the parameter of the model candidate. Specifically, the value of the parameter to be estimated is changed via the simulation unit 23. Subsequently, the output value is calculated using the data of the sensor registered in the item of "input" and the physical model in the sensor ID 404 of the machine configuration table T40. Subsequently, in the sensor ID 404 of the machine configuration table T40, the data of the sensor registered in the item of "output" and the error of the output value from the simulation unit 23 are calculated, and the parameter is calculated for a minimum error. The minimum of the error is referred to as "accuracy" of the model candidate. Then, information related to the calculated parameter, the physical model, and the accuracy is stored in the temporary storage unit.

When the model candidate is an induction model, the induction model is learned again by using the model metadata 603 stored in the model data table T60 and the data of the sensor registered in the sensor ID 404 of the machine configuration table T40. Then, information related to preprocessing, modeling, determination method, and accuracy of the relearned induction model are stored in the temporary storage unit.

When the processing of all the components of the machine B is completed (step S203: Yes), the display unit 30 displays a model candidate list including information related to newly created model candidates stored in the temporary storage unit (model metadata of the deduction model and the induction model) and the accuracy of the model candidates (step S208). After receiving the information of the model to be created, which is selected by the administrator 3 at the input unit 31, the information of the model is stored in the model data table T60 (step S209).

Although a case where a model is newly created has been described as an example in the above description, similar processing may be executed when a model is updated.

FIG. 12 is a diagram showing an example of a screen displayed on the display unit 30 in step S208. A display screen 303 displays a configuration diagram 3031 of the components of the machine B, information about model candidates to be newly created (model metadata of the deduction model and the induction model), and a model candidate list 3032 that indicates the accuracy of the model candidates. The model candidate list 3032 is created for each component, and FIG. 12 shows a model candidate list of the speed increasing machine bc3.

The model candidate list 3032 of the component is displayed when a specific component is selected from the input unit 31 by the administrator 3.

The model candidate list 3032 includes information of model type, model metadata, and accuracy. Although an order of models displayed in the model candidate list 3032 is arbitrary, the administrator 3 who confirms the display unit 30 easily selects an optimal model when listing is performed in descending order of accuracy of the models (that is, in ascending order of error). After the administrator 3 selects an optimal model from the input unit 31 and presses a "determine" button, the model is stored in the model data table T60 (see the above-described step S209).

After the above-described processing, the model candidate list 3032 of a component is displayed when another component is selected from the input unit 31 by the administrator 3, and the similar processing can be executed.

When there is no appropriate model in the model candidate list 3032, when the administrator 3 selects a "create new" button, a separate model is created.

The condition monitoring unit 27 monitors the condition of the machine using the sensor data table T10, the machine configuration table T40, and the model data table T60 stored in the storage unit 22.

FIG. 13 is a flowchart showing processing of the condition monitoring unit 27. First, sensor data, components, corresponding model metadata, and model data of a monitoring target machine are acquired from the sensor data table T10, the machine configuration table T40, and the model data table T60 (step S301). Subsequently, it is determined whether all components of the target machine have been processed (step S302). When all components have been processed (step S302: Yes), the result stored in the temporary storage unit is notified to the administrator 3 (step S305). When all components have not been processed (step S302: No), an abnormality determination using the model is performed (step S303), and a result thereof is stored in the temporary storage unit (step S304).

In step S303, processing contents are different depending on a model to be used and a determination method thereof. When the model is an induction model, abnormality is determined using the model metadata described in the model data table T60.

A determination method in a case where the model is a deduction model is shown in FIGS. 14 and 15. FIG. 14 is a flowchart showing processing when the determination method is the "priori calculation method". First, simulation of sensor data is performed using the simulation unit 23 according to a range of parameters stored in the model data table T60 of the storage unit 22 (step S401). For example, when the model ID 601 of the model data table T60 in FIG. 8 is a model of am3, the gear ratio r of the speed increasing machine ac3 is changed from 50 to 120, and an output rotation number of the speed increasing machine is calculated.

Subsequently, a distribution of the acquired sensor data and a distribution of the sensor data which is a simulation execution result in step S401 are compared, and a closest distribution of data and a corresponding parameter thereof is estimated (step S402). For example, when the gear ratio r is changed from 50 to 120, the distribution of the output rotation number of the speed increasing machine and an actual distribution of the sensor data recorded in the sensor data table T10 of the storage unit 22 are compared, and a closest gear ratio r (r=120, for example) is acquired.

Subsequently, it is determined whether the gear ratio r estimated in step S402 is within a normal range (step S403), and when it deviates from the normal range, the component is assumed to be in an abnormal condition (step S404). On the other hand, when it is within the normal range, it is assumed that the component is in the normal condition (step S405).

That is, in the case of the "priori calculation method", the simulation of the sensor data is executed according to the parameter range of the model stored in the storage unit 22, the parameter is estimated from a comparison result of the acquired sensor data and the simulation execution result. When the estimated parameter deviates from the normal range, the component is determined to be in the abnormal condition.

FIG. 15 is a flowchart illustrating processing when the determination method is the "parameter estimation method". First, sensor data of a target component is acquired from the sensor data table T10 of the storage unit 22 (step S501). Subsequently, it is determined whether the error of simulation is equal to or less than a certain value (step S502). When the error of the simulation is not equal to or smaller than the certain value (step S502: No), the simulation is executed again by changing the parameter (step S503), and the sensor data output by the simulation and the error of the sensor data acquired in step S501 are calculated (step S504). On the other hand, in step S502, when the simulation error is equal to or smaller than a certain value (step S502: Yes), it is determined whether the parameter used in the simulation is in the normal range (step S505), and when the parameter is not in the normal range, the component is determined to be in an abnormal condition (step S506). On the other hand, when the parameter is within the normal range, it is determined that the component is in the normal condition (step S507).

That is, in the case of "parameter estimation method", the parameter is changed until the error between the acquired sensor data and the simulation of the sensor data is equal to or less than a certain value, and when the parameter which is in the case of equal to or less than a certain value deviates from the normal range, the component is determined to be in the abnormal condition.

As described above, according to the embodiment of the invention, a model for a particular machine is created by using a model for a machine similar to the particular machine that has already been created. Therefore, manhours for newly creating a model can be reduced.

Variations of the model accumulated in the storage unit 22 are expanded by newly creating a model not only using a product of a different model from the same manufacturer, but also using a product from a different manufacturer. Therefore, manhours for newly creating a model can be further reduced.

The invention is not limited to the above embodiment, and includes various modifications. The above-described embodiment is described in detail for easy understanding of the invention, and the invention is not necessarily limited to those including all the configurations described above.

For example, although an example in which both the deduction model and the induction model are provided has been described in the above embodiment, a configuration including any one of the models may be used.

Although the "priori calculation method" and the "parameter estimation method" have been described as examples of the determination method when the model is a deduction model, the invention is not limited to these determination methods.

REFERENCE SIGN LIST

A, B: machine
1 condition monitoring system
2 maintenance person
3 administrator
21 sensor data acquisition unit
22 storage unit
23 simulation unit
24 sensor map creation unit
25 machine configuration map creation unit
26 model creation unit
27 condition monitoring unit
28 user IF unit
30 display unit
31 input unit
T10 sensor data table
T20 sensor list table
T30 sensor map table
T40 machine configuration table
T50 machine configuration map table
T60 model data table

The invention claimed is:

1. A condition monitoring system that collects operation data from a machine and monitors a condition of the machine, the condition monitoring system comprising:
 a storage that stores information indicating components of a first machine for which a model for a sensor data analysis has been created and components of a second machine for which the model is newly created, information indicating a correspondence relationship between the components of the first machine and the components of the second machine, and information relating to the model;

a processing device configured to:
create model candidates of the second machine from the model similar to the second machine by using the information stored in the storage, and creates information relating to a model candidate selected via an input unit out of the model candidates as the model of the second machine; and
search for a list of sensors of the first machine and sensors of the second machine, control to display information indicating a corresponding relationship between the sensors of the first machine and the sensors of the second machine on the display, and store, in the storage, the information indicating the corresponding relationship between the sensors of the first machine and the sensors of the second machine input by the input unit; and
a display that displays the model candidates.

2. The condition monitoring system according to claim 1, wherein the processing device is further configured to:
search for a list of the components of the first machine and the components of the second machine, control to display information indicating a corresponding relationship between the components of the first machine and the components of the second machine on the display, and store, in the storage, the information indicating the corresponding relationship between the components of the first machine and the components of the second machine input by the input unit.

3. The condition monitoring system according to claim 1, wherein
the display displays accuracy of the model candidates calculated by the processing device.

4. The condition monitoring system according to claim 3, wherein
the display displays the model candidates in descending order of accuracy of the model candidates.

5. The condition monitoring system according to claim 1, wherein the processing device is further configured to:
when the model is a deduction model that expresses a physical phenomenon or behavior of a component of a target machine by a mathematical expression, execute simulation of sensor data according to a parameter range of the model stored in the storage unit, estimate a parameter from a comparison result of acquired sensor data and a simulation execution result, and determine the component to be in an abnormal condition when the estimated parameter deviates from a normal range.

6. The condition monitoring system according to claim 1, wherein the processing device is further configured to:
when the model is a deduction model that expresses a physical phenomenon or behavior of a component of a target machine by a mathematical expression, change a parameter until an error between acquired sensor data and simulation of sensor data is equal to or less than a predetermined value, and determine the component to be in an abnormal condition when the parameter in a case where the error is equal to or less than the predetermined value deviates from a normal range.

* * * * *